United States Patent [19]
Takeda

[11] Patent Number: 5,923,277
[45] Date of Patent: Jul. 13, 1999

[54] REFERENCE VOLTAGE GENERATING CIRCUIT FOR USE IN SERIES-PARALLEL A/D CONVERTER

[75] Inventor: Hitoshi Takeda, Yokohama, Japan

[73] Assignee: Kabushiki Kaisha Toshiba, Kawasaki-shi, Japan

[21] Appl. No.: 08/878,608

[22] Filed: Jun. 19, 1997

[30]     Foreign Application Priority Data

Jun. 20, 1996 [JP] Japan ................................... 8-159690

[51] Int. Cl.$^6$ ................................................. H03M 1/14
[52] U.S. Cl. .......................................... 341/156; 341/159
[58] Field of Search .................................. 341/155, 156, 341/159

[56]                References Cited

U.S. PATENT DOCUMENTS

| | | | |
|---|---|---|---|
| 4,533,903 | 8/1985 | Yamada et al. | 341/156 |
| 4,903,028 | 2/1990 | Fukushima | 341/156 |
| 5,099,240 | 3/1992 | Nakatani et al. | 341/156 |
| 5,187,483 | 2/1993 | Yonemaru | 341/156 |
| 5,696,510 | 12/1997 | Paillardet et al. | 341/156 |
| 5,726,653 | 3/1998 | Hsu et al. | 341/156 |
| 5,745,067 | 4/1998 | Chou et al. | 341/156 |

*Primary Examiner*—Marc S. Hoff
*Attorney, Agent, or Firm*—Oblon, Spivak, McClelland, Maier & Neustadt, P.C.

[57]           ABSTRACT

A series-parallel A/D converter having a plurality of reference resistors, a first comparator section, a second comparator section, groups of switches, and lower-reference voltage lines. The reference resistors divide a full-scale voltage, generating different reference voltages. They are connected in series, forming blocks of resistors. The first comparator section compares an input voltage with upper reference voltages and selects one of the blocks of resistors in accordance with the result of comparison. The groups of switches applies the voltages at the nodes of the reference resistors of the selected block, to the lower-reference voltage lines. When the block BL0 is selected, voltages Vr0 and Vr8 are applied to the lower-reference voltage lines L0 and L8, respectively. When the block BL1 is selected, voltages Vr16 and Vr8 are applied to the lines L0 and L8, respectively. That is, the voltage applied through the line L8 remains unchanged, whichever block of resistors is selected.

5 Claims, 2 Drawing Sheets

REFERENCE VOLTAGE GENERATING CIRCUIT FOR USE IN SERIES-PARALLEL A/D CONVERTER

BACKGROUND OF THE INVENTION

The present invention relates to a series-parallel A/D (Analog-to-Digital) converter and, in particular, to a reference voltage generating circuit for use in a series-parallel A/D converter.

A/D converters are classified into parallel type and series-parallel type.

A parallel A/D converter has $2^n$ comparators and $2^n$ reference resistors, where n is resolution and presented by a number of bits. The $2^n$ reference resistors divide the full-scale voltage into various voltages. The comparators compare the voltages thus obtained with an input voltage (i.e., input analog data), thereby converting the input analog data to digital data. The parallel A/D converter generally achieves high-speed, high-precision analog-to-digital conversion. However, the higher its resolution, the more elements it needs to have, and the more power it consumes.

A series-parallel A/D converter converts input analog data in two steps. In the first step it converts the first half of the data to upper bits. In the second step it converts the second half of the data to lower bits. The reference voltages are determined by the result of comparison performed by the comparators used to convert the second half of the data to lower bits. The series-parallel A/D converter can be composed of far less elements than a parallel A/D converter; it is smaller and consumes less power, than a parallel A/D converter. However, it is inferior to a parallel A/D converter in terms of operating speed and conversion precision.

FIG. 1 shows a 6-bit, 2-step series-parallel A/D converter. For simplicity, it is assumed that this A/D converter is designed to convert analog data (i.e., input voltage) Vin into 6-bit digital data, by first converting the first half of the input data to three bits and then converting the second half of the input data to three bits.

As shown in FIG. 1, the series-parallel A/D converter comprises a reference voltage generator 1, two comparator sections 2 and 4, two encoders 3 and 5, and digital correction circuit 6.

The reference voltage generator 1 has 64 (=$2^6$) reference resistors R0 to R63. The resistors R0 to R63 have the same resistance and divide a full-scale voltage (VRT−VRB) into different voltages, any adjacent two of which differ by the same value. The resistors R0 to R62 are connected in series, forming a line. This line is folded back repeatedly, in the form of a rectangular wave, each longer straight segment consisting of four resistors. As a result, the reference resistors R0 to R63 are arranged in 16 rows and 4 columns.

The reference resistors R0 to R63 form 8 (=$2^3$) blocks BL0 to BL7, each consisting of two rows of resistors, or eight reference resistors. To be more specific, the block BL0 is composed of the resistors R0 to R7; the resistor R0 is connected to a terminal 11, and the resistor R7 to the comparator CPM0 of the first comparator section 2. The block BL1 is composed of the resistors R8 to R15; the resistors R8 and R15 are connected to the comparators CPM0 and CPM1 of the first comparator section 2, respectively. The block BL7 is composed of the resistors R56 to R63; the resistor R56 is connected to the comparator CPM6, and the resistor R63 to a terminal 12.

The first comparator section 2 is provided to process the first half of the input analog data Vin, thereby to generate upper three bits of digital data. The second comparator section 4 is used to process the second half of the input analog data Vin, thereby to generate lower three bits of digital data.

The ends of each block and the nodes among the eight resistors thereof are connected to the comparators CPL0 to CPL8 of the second comparator section 4. The reference voltages applied to the comparators CPL0 to CPL8 are generated in one of the blocks BL0 to BL7 which has been selected.

When any block BLi is selected, where i is an integer ranging from 0 to 7, one of the reference voltages generated in the block BLi overlaps one of the reference voltages generated in the next block BLi+1. The overlap is provided to cancel out the difference between the result of comparison performed by the first comparator section 2 and the result of comparison performed by the second comparator section 4.

The switches included in each block of resistors are simultaneously turned on or off. More precisely, one of the blocks BL0 to BL7 is selected in accordance with the result of the comparison performed by the first comparator section 2, and all switches of a block thus selected are turned on, while all switches of any other block are turned off. When the switches of the block selected are turned on, the reference voltages generated by this block are applied to the comparators of the second comparator section 4 through lower-reference voltage lines L0 to L8. The voltage VL0 applied via the line L0 is lower than the voltage VL1 applied via the line L1, the voltage VL1 is lower than the voltage VL2 applied via the line L2, and so forth. That is, VL0<VL1<VL2 . . . <VL8.

The input voltage Vin (i.e., the input analog data) is applied to the comparators CPM0 to CPM6 of the first comparator section 2, and also to the comparators CPL0 to CPL8 of the second comparator section 4. The output of the first comparator section 2 is supplied to the first encoder 3. The encoder 3 converts the output of the section 2 to upper three bits, which are input to the digital correction circuit 6. Meanwhile, the output of the second comparator section 4 is supplied to the second encoder 5. The encoder 5 converts the output of the section 4 to lower three bits, which are input to the digital correction circuit 6. The digital correction circuit 6 outputs 6-bit digital data.

How the series-parallel A/D converter operates when VRB<VRT and the reference registers R0 to R63 divide the voltage (VRT−VRB), generating voltages Vr0 (=VRB) to Vr64 (=VRT), will be explained below.

Reference voltages Vr8, Vr18, Vr24, Vr32, Vr40, Vr48 and Vr56 which would be obtained by dividing the full-scale voltage (VRT−VRB) by eight (=$2^3$) reference resistors and which define 3-bit resolution are input to the first comparator section 2. In the first comparator section 2, these seven reference voltages are compared with the input voltage Vin (i.e., the input analog data). The difference between each reference voltage and the input voltage Vin is thereby determined.

As shown in FIG. 1, eight groups S0 to S7 of switches are provided in the blocks BL0 to BL7, respectively. As seen from Table 1 presented below, the first comparator section 2 turns on the switches of the group used in the selected block, while maintaining the switches of any other group off.

TABLE 1

| Input voltage Vin | States of the switches |
| --- | --- |
| Vr8 > Vin | Switches of group S0 are on |
| Vr16 > Vin > Vr8 | Switches of group S1 are on |
| Vr24 > Vin > Vr16 | Switches of group S2 are on |
| . | . |
| . | . |
| . | . |
| Vin > Vr56 | Switches of group S7 are on |

When the input voltage Vin is lower than Vr16 and higher than Vr8, for example, the first comparator section 2 turns on only the switches of the group S1 provided in the block BL1, while maintaining the switches of the groups S0 and S2 to S7 off.

Thereafter, nine reference voltages are compared with the input voltage Vin in the second comparator section 4. As shown in Table 2 below, the reference voltages are input to the second comparator section 4 through the lower-reference voltage lines L0 to L8. As mentioned above, the voltages VL0, VL1, VL2, . . . and VL8, which are applied via the lines L0 to L8, have the relationship of: VL0<VL1<VL2 . . . <VL8.

TABLE 2

| | Voltage lines | | | | | | | | |
| --- | --- | --- | --- | --- | --- | --- | --- | --- | --- |
| Switches turned on | L0 | L1 | L2 | L3 | L4 | L5 | L6 | L7 | L8 |
| S7 | | Vr56 | Vr57 | Vr58 | Vr59 | Vr60 | Vr61 | Vr62 | Vr63 | Vr64 |
| . | . | . | . | . | . | . | . | . | . |
| . | . | . | . | . | . | . | . | . | . |
| . | . | . | . | . | . | . | . | . | . |
| S3 | | Vr24 | Vr25 | Vr26 | Vr27 | Vr28 | Vr29 | Vr30 | Vr31 | Vr32 |
| S2 | | Vr16 | Vr17 | Vr18 | Vr19 | Vr20 | Vr21 | Vr22 | Vr23 | Vr24 |
| S1 | | Vr8 | Vr9 | Vr10 | Vr11 | Vr12 | Vr13 | Vr14 | Vr15 | Vr16 |
| S0 | | Vr0 | Vr1 | Vr2 | Vr3 | Vr4 | Vr5 | Vr6 | Vr7 | Vr8 |

When the switches of the group S1 are on, that is, when the input voltage Vin is between Vr8 and Vr16, the reference voltages Vr8 to Vr16 are input to the second comparator section 4 through the lower-reference voltage lines L0 to L8.

The results of comparison performed in the first comparator section 2 are input to the first encoder 3. The encoder 3 converts the result of comparison to upper 3-bit digital data. On the other hand, the result of comparison performed in the second comparator section 4 is input to the second encoder 5. The encoder 5 converts the result of comparison to lower 3-bit digital data. The upper 3-bit digital data and the lower 3-bit digital data are input from the digital correction circuit 6. The circuit 6 eliminates the over-ranging of the lower 3-bit data and generates 6-bit digital data.

Assume that the switches of the group S0 are turned off and the switches of the group S1 are turned on in the reference voltage generator 1. In this case, the reference voltages applied through the lower-reference voltage lines L0 to L8 are changed, each by a value corresponding to eight reference resistors. Having the voltage generator 1 in which the reference voltages change so, the series-parallel A/D converter is disadvantageous in the following respects:

1. Since the halves of the input data (analog data) are independently converted to upper bits and lower bits, respectively, the reference voltages used in converting the second half of the input data to lower bits must be changed in accordance with the result of the comparison with the input voltage. To change the reference voltages, the A/D converter needs to have lower-reference voltage lines L0 to L8 and groups S0 to S7 of switches. When the switches of any group are turned on or off, the parasitic capacitances C0 to C8 of the lower-reference voltage lines L0 to L8 are charged or discharged, requiring some time (i.e., settling time). Consequently, the speed of converting the analog input data to digital data decreases.

2. If the input voltage Vin is nearly equal to any upper-reference voltage, the digital data the A/D converter outputs may be inaccurate. For instance, if the input voltage Vin is nearly equal to the upper-reference voltage Vr8, the switches of the group S0 or S1 are selected. If the switches of the group S0 are selected, the lower-reference voltage Vr8 is input to the comparator CPL8 via the lower-reference voltage line L8. If the switches of the group S1 are selected, the lower-reference voltage Vr8 is input to the comparator CPL0 through the lower-reference voltage line L0. Generally, if the voltage Vin is nearly equal to an upper-reference voltage Vri (i=8, 16, 32, 40, 48 or 56), the voltage Vri is input to one comparator or another, depending on which group of switches has been selected. The comparators differ in operating characteristic, inevitably because they have been made under different conditions. This is why the A/D converter may output inaccurate digital data if the input voltage Vin is nearly equal to any upper-reference voltage.

BRIEF SUMMARY OF THE INVENTION

The present invention has been made to eliminate the above-mentioned disadvantages of the conventional series-parallel A/D converter. Its object is to provide a series-parallel A/D converter which converts analog data to digital data at high speed in spite of settling time and which outputs accurate digital data even if the input voltage is nearly equal to an upper-reference voltage.

To achieve the object, a series-parallel A/D converter according to the invention comprises: an input terminal connected to receive an input voltage; a first and a second terminal; a plurality of reference resistors connected in series and forming a plurality of blocks, for dividing a voltage applied between the first and second terminal, thereby to generate reference voltages; a first comparator section comprised of comparators for comparing the input voltage with the reference voltages which are applied at nodes of the resistors of each blocks and which are used as upper reference voltages, thereby to select one of the blocks which generates a reference voltage nearly equal to the input voltage; a plurality of lower-reference voltage lines; groups of switches for applying voltages at nodes of the resistors of the blocks, as lower reference voltages, to the lower-reference voltage lines; a second comparator unit comprised of comparators for comparing the input voltage with the lower reference voltages applied through the lower-reference voltage lines; and encoding means for generating digital data from the result of comparison performed in the first comparator section and the result of comparison performed in the second comparator section.

The groups of switches alternately apply two voltages defined below, each voltage every time the block of reference resistors, which has been selected by the first comparator section, is switched to another:

a) $VL0=Vri+0, \ldots, VLj=Vri+j$ b) $VL0=Vri+j, \ldots, VLj=Vri+0$ where $Vri+0, \ldots Vri+j$ are the voltages applied at the nodes of the reference resistors of the block selected by the first comparator section, $Vri+0 < \ldots < Vri+j$ (i and j are integers identifying the blocks of resistors), and $VL0, \ldots VLj$ are the voltages applied through the lower-reference voltage lines.

The reference resistors may be arranged in rows and columns, forming a rectangular wave which extends along the columns of reference resistors. The first comparator section may be located at one end of each column of reference resistors, and the second comparator section may be located at one end of each row of reference resistors, and the lower-reference voltage lines extend along the columns of reference resistors.

The encoding means may comprise an upper-bit encoder connected to the first comparator section and a lower-bit encoder connected to the second comparator section. The lower-bit encoder may have two encoders and the upper-bit encoder which are provided to encode the result of comparison performed in the first comparator section and the result of comparison performed in the second comparator section, respectively, and which are alternately operated every time the block of reference resistors, which has been selected by the first comparator section, is switched to another.

The reference resistors are provided in a number of $2^n$. The encoding means generates n-bit digital data from the result of comparison performed in the first comparator section and the result of comparison performed in the second comparator section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A series-parallel A/D converter according to the present invention will be described in detail, with reference to FIG. 2. Shown in FIG. 2 is a 6-bit, 2-step series-parallel A/D converter according to the invention.

This A/D converter is designed to convert two halves of input analog data to upper three bits and lower three bits, respectively, to generate 6-bit digital data ultimately, as the conventional series-parallel A/D converter described earlier.

Figure 2:
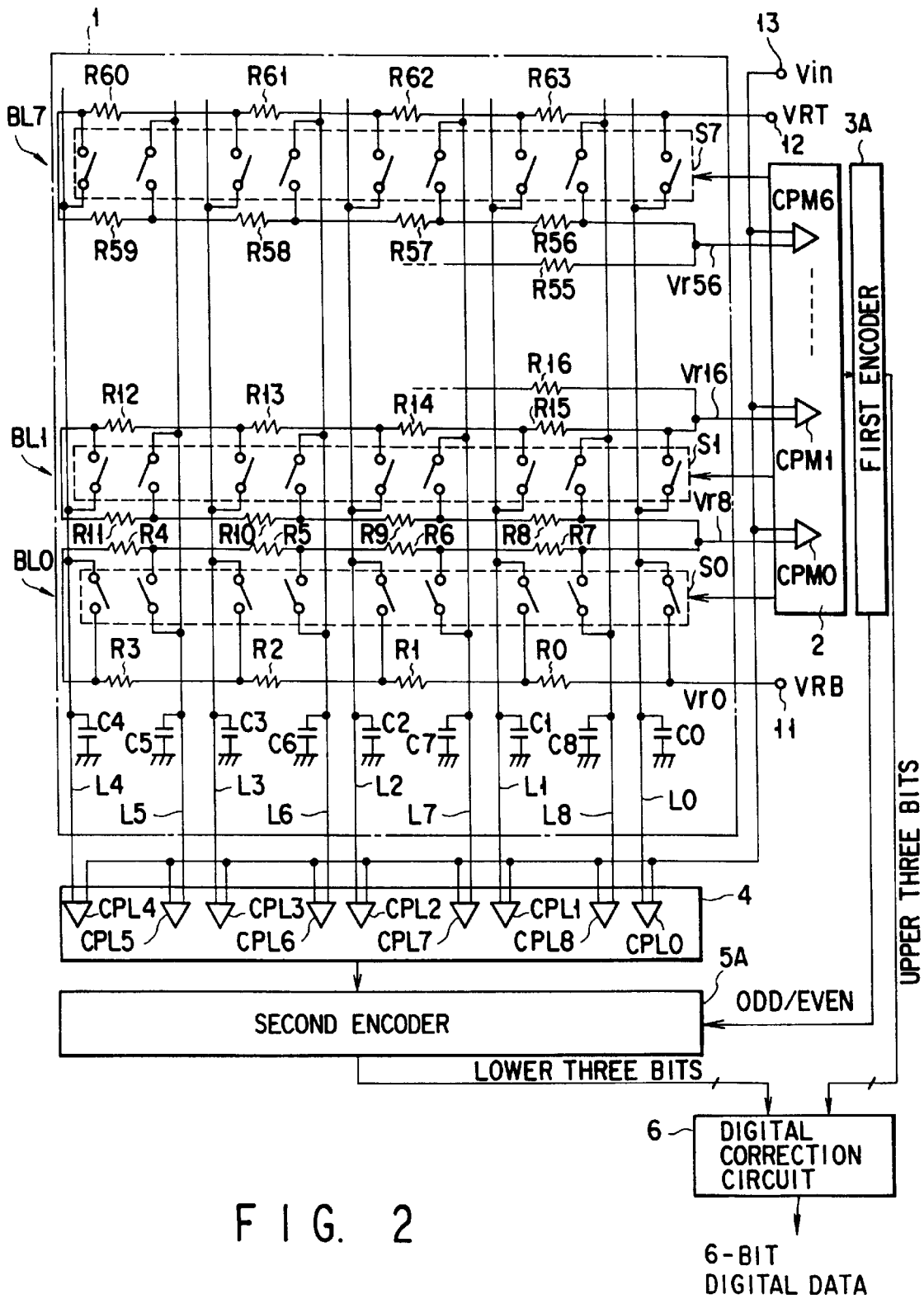
FIG. 2 is a circuit diagram showing a series-parallel A/D converter according to the present invention.

As shown in FIG. 2, the series-parallel A/D converter comprises a reference voltage generator 1, two comparator sections 2 and 4, two encoders 3A and 5A, and a digital correction circuit 6.

The reference voltage generator 1 has 64 ($=2^6$) reference resistors R0 to R63. The resistors R0 to R63 have the same resistance and divide a full-scale voltage (VRT−VRB) into voltages, any two adjacent of which differ by the same value. The resistors R0 to R63 are connected in series, forming a line. This line is folded back repeatedly, in the form of a rectangular wave, each longer straight segment consisting of four resistors. As a result, the reference resistors R0 to R63 are arranged in 16 rows and 4 columns.

The reference resistors R0 to R63 form 8 ($=2^3$) blocks BL0 to BL7, each consisting of two rows of resistors, or eight reference resistors. To be more specific, the block BL0 is composed of the resistors R0 to R7; the resistor R0 is connected to a terminal 11, and the resistor R7 to the comparator CPM0 of the first comparator section 2. The block BL1 is composed of the resistors R8 to R15; the resistors R8 and R15 are connected to the comparators CPM0 and CPM1 of the first comparator section 2, respectively. The block BL7 is composed of the resistors R56 to R63; the resistor R56 is connected to the comparator CPM6, and the resistor R63 to a terminal 12.

The first comparator section 2 is provided to process the first half of the input analog data Vin, thereby to generate upper three bits of digital data. The second comparator section 4 is used to process the second half of the input analog data Vin, thereby to generate lower three bits of digital data.

The ends of each block and the nodes among the eight resistors thereof are connected to the comparators CPL0 to CPL8 of the second comparator section 4. The reference voltages applied to the comparators CPL0 to CPL8 are generated in one of the blocks BL0 to BL7 which has been selected.

When any block BLi is selected, where i is an integer ranging from 0 to 7, one of the reference voltages generated in the block BLi overlaps one of the reference voltages generated in the next block BLi+1. The overlap is provided to cancel out the difference between the result of comparison performed by the first comparator section 2 and the result of comparison performed by the second comparator section 4.

The switches included in each block of resistors are simultaneously turned on or off. More precisely, one of the blocks BL0 to BL7 is selected in accordance with the result of the comparison performed by the first comparator section 2, and all switches of a block thus selected are turned on, while all switches of any other block are turned off. When the switches of the block selected are turned on, the reference voltages generated by this block are applied to the comparators of the second comparator section 4 through lower-reference voltage lines L0 to L8.

When the switch of any even-numbered block (BL0, BL2, BL4 or BL6) are selected, the voltages VL0 to VL8 applied through the lower-reference voltage lines L0 to L8, respectively, have the relationship of: $VL0 < VL1 < VL2 \ldots < VL8$. By contrast, when the switch of any odd-numbered block (BL1, BL3, BL5 or BL7) are selected, the voltages VL0 to VL8 applied through the lower-reference voltage lines L0 to L8, respectively, have the relationship of: $VL0 > VL1 > VL2 \ldots > VL8$.

The input voltage Vin is applied to the comparators CPM0 to CPM6 of the first comparator section 2, and also to the comparators CPL0 to CPL8 of the second comparator section 4. The output of the first comparator section 2 is supplied to the first encoder 3A. The encoder 3A converts the output of the section 2 to upper three bits, which are input to the digital correction circuit 6. Meanwhile, the output of the second comparator section 4 is supplied to the second encoder 5A. The encoder 5A converts the output of the section 4 to lower three bits, which are input to the digital correction circuit 6. The digital correction circuit 6 outputs 6-bit digital data.

As indicated above, the relationship among the voltages VL0 to VL8 applied through the lower-reference voltage lines L0 to L8 is inverted every time the selected block of resistors is switched from an even-numbered one to an odd-numbered one, or the other way around. (That is, the voltage VL0 is the highest when an even-numbered block is selected, and the voltage VL8 is the highest when an odd-numbered block is selected.) As a result, the output of the second comparator section 4 (i.e., the result of comparison) is inverted every time the selected block of resistors is switched from an even-numbered one to an odd-numbered one, or vice versa.

To invert the relationship among the voltages VL0 to VL8 in this manner, the first encoder 3A supplies a control signal ODD/EVEN to the second encoder 5A. The second encoder 5A has two encoder units. The first encoder unit is used when the block selected is an even-numbered one, and the second encoder unit is used when the block selected is an odd-numbered one. In other words, the control signal ODD/EVEN selects either the first encoder unit or the first encoder unit.

The second encoder 5A may suffice to have only one encoder unit in order to perform its function no matter whether an even-numbered block or an odd-numbered block is selected, like the encoder disclosed in Japanese Patent Application No. 7-290404 which the assignee of the present application filed on Jul. 12, 1995. In this case, the encoder unit operates in one way or the other, in accordance with the number of the output voltages of the second comparator section 4 which are higher than a threshold value, not in accordance with whether the voltage VL0 or the voltage VL8 is the highest. Having only one encoder unit, the second encoder 5A can be smaller than otherwise, making it possible to reduce the size of the series-parallel A/D converter.

How the series-parallel converter shown in FIG. 2 operates will now be explained.

Assume VRB<VRT and that the reference registers R0 to R63 divide the voltage (VRT−VRB), generating voltages Vr0 (=VRB) to Vr64 (=VRT).

Reference voltages Vr8, Vr16, Vr24, Vr32, Vr40, Vr48 and Vr56 which would be obtained by dividing the full-scale voltage (VRT−VRB) by eight (=$2^3$) reference resistors and which define 3-bit resolution are input to the first comparator section 2. In the first comparator section 2, these seven reference voltages are compared with the input voltage Vin (i.e., the input analog data). The difference between each reference voltage and the input voltage Vin is thereby determined.

As seen from Table 1 presented above, the first comparator section 2 turns on the switches of the group used in the selected block, while maintaining the switches of any other group off.

When the input voltage Vin is lower than Vr16 and higher than Vr8, for example, the first comparator section 2 turns on only the switches of the group S1 provided in the block BL1, while maintaining the switches of the groups S0 and S2 to S7 off.

Thereafter, nine reference voltages are compared with the input voltage Vin in the second comparator section 4. As shown in Table 3 below, the reference voltages are input to the second comparator section 4 through the lower-reference voltage lines L0 to L8. The voltages VL0 to VL8 applied via the lines L0 to L8 have the relationship of: VL0<VL1<VL2 . . . <VL8 when an even-numbered block, BL0, BL2, BL4 or BL6 is selected. When an odd-numbered block, BL1, BL3, BL5 or BL7 is selected, the voltages VL0 to VL8 have the relationship of: VL0>VL1>VL2 . . . >VL8.

TABLE 3

| | Voltage lines | | | | | | | | |
|---|---|---|---|---|---|---|---|---|---|
| Switches turned on | L0 | L1 | L2 | L3 | L4 | L5 | L6 | L7 | L8 |
| S7 | Vr64 | Vr63 | Vr62 | Vr61 | Vr60 | Vr59 | Vr58 | Vr57 | Vr56 |
| . | . | . | . | . | . | . | . | . | . |
| . | . | . | . | . | . | . | . | . | . |
| S3 | Vr32 | Vr31 | Vr30 | Vr29 | Vr28 | Vr27 | Vr26 | Vr25 | Vr24 |
| S2 | Vr16 | Vr17 | Vr18 | Vr19 | Vr20 | Vr21 | Vr22 | Vr23 | Vr24 |
| S1 | Vr16 | Vr15 | Vr14 | Vr13 | Vr12 | Vr11 | Vr10 | Vr9 | Vr8 |
| S0 | Vr0 | Vr1 | Vr2 | Vr3 | Vr4 | Vr5 | Vr6 | Vr7 | Vr8 |

When the switches of the group S0 are on, that is, when the input voltage Vin is between Vr0 and Vr8, the reference voltages Vr0 to Vr8 are input to the second comparator section 4 through the lower-reference voltage lines L0 to L8. When the switches of the group S1 are on, that is, when the input voltage Vin is between Vr8 and Vr16, the reference voltages Vr8 to Vr16 are input to the second comparator section 4 through the lower-reference voltage lines L0 to L8.

The result of comparison performed in the first comparator section 2 is input to the first encoder 3A. The encoder 3A converts the result of comparison to upper 3-bit digital data. On the other hand, the result of comparison performed in the second comparator section 4 are input to the second encoder 5A. The encoder 5A converts the result of comparison to lower 3-bit digital data.

As shown in Table 3 presented above, the voltages VL0 to VL8 applied via the lines L0 to L8 have the relationship of: VL0<VL1<VL2 . . . <VL8 when the switches of an even-numbered block, BL0, BL2, BL4 or BL6 is selected, and have the relationship of: VL0>VL1>VL2 . . . >VL8 when the switches of an odd-numbered block, BL1, BL3, BL5 or BL7 is selected. The first encoder 3A generates a control signal ODD/EVEN which indicates whether the odd-numbered blocks or the even-numbered blocks have been selected. The control signal ODD/EVEN is supplied to the second encoder 5A.

In the second encoder 5A, the second encoder unit of the second encoder 5A is used to encode the outputs of the second comparator section if the control signal ODD/EVEN indicates that an odd-numbered block has been selected. Conversely, if the control signal ODD/EVEN indicates that an even-numbered block has been selected, the first first encoder unit of the second encoder 5A is used to encode the result of the comparison performed in the second comparator section 4.

The digital correction circuit 6 processes the upper 3-bit digital data output by the first encoder 3A and the lower 3-bit digital data output by the second encoder 5A. It eliminates the over-ranging of the lower 3-bit data and generates 6-bit digital data.

As seen from Table 3, the switches of the group S0 are tuned off and the switches of the group S1 are turned on when the input voltage Vin rises above the reference voltage Vr8 applied to the first comparator section 2. In this case, the reference voltage applied to the lower-reference voltage line L8 remains at the value of Vr8, while the voltage applied to, for example, the lower-reference voltage Line L7 changes by a value corresponding to two reference resistors.

Figure 1:
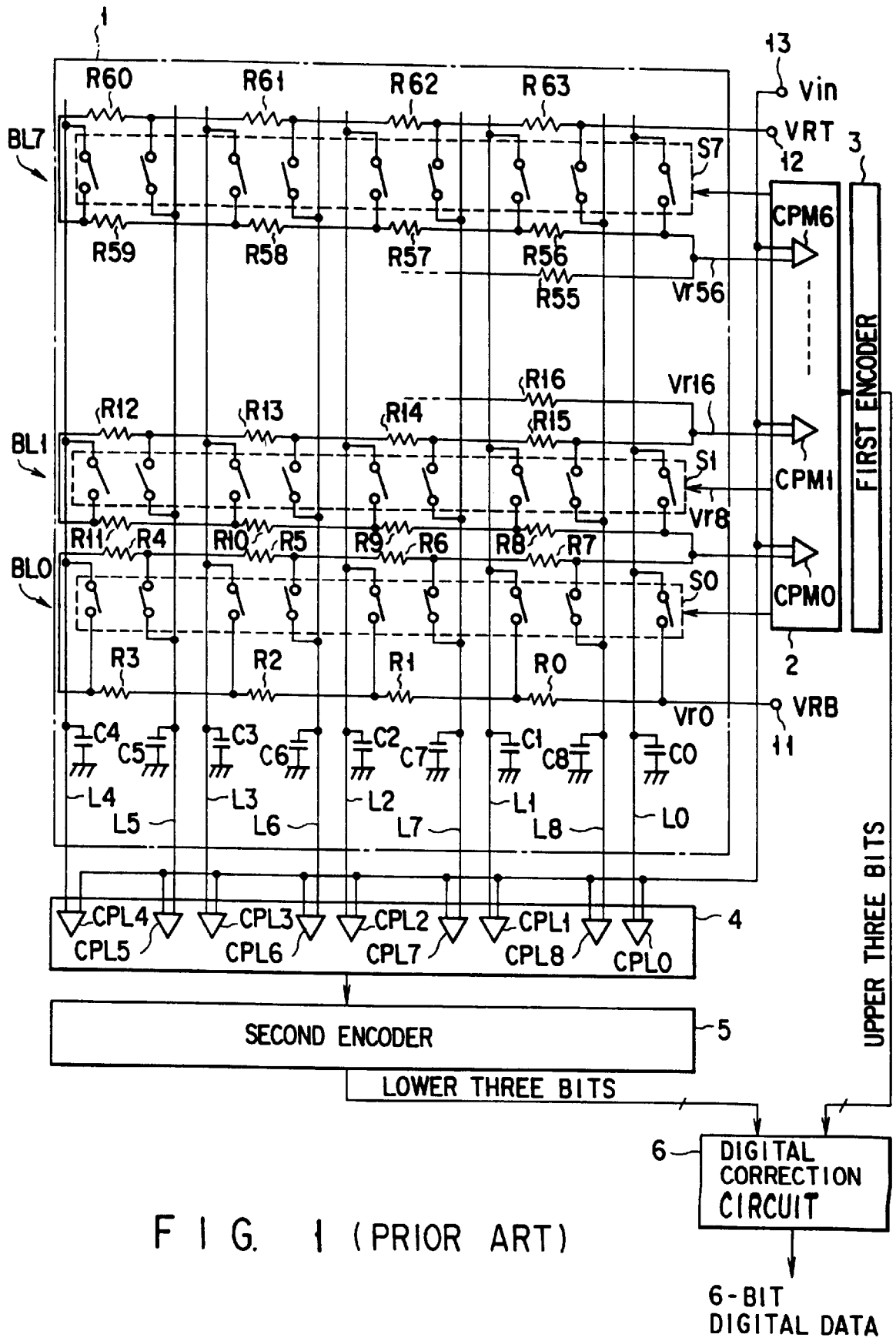
FIG. 1 is a circuit diagram showing a conventional series-parallel A/D converter.

In the conventional converter of FIG. 1, i.e., a 6-bit, 2-step series-parallel A/D converter, the reference voltages applied through the lower-reference voltage lines L0 to L8 change by a value corresponding to eight reference resistors when the input voltage Vin rises above the reference voltage Vr8 applied to the first comparator section 2. The settling time for charging and discharging one of the lower-reference voltage lines (for example, the line L8) is inevitably long. As a consequence, the speed of converting the analog input data to digital data decreases.

In the A/D converter of the invention, i.e., a turnaround series-parallel A/D converter, the reference voltage applied via the lower-reference voltage line L8 remains at Vr8, not changing at all, when the switches of the group S0 are turned off and those of the group S1 are turned on. At this time, the input voltage Vin rises above the reference voltage Vr8 applied to the first comparator section 2. Nonetheless, no time is required to charge or discharge the lower-reference voltage line L8. The A/D converter can therefore convert the analog input data to digital data at high speed.

When the switches of the group S0 are turned off and those of the group S1 are turned on, the reference voltages applied via the lower-reference voltage line L0 changes from Vr0 to Vr16, by a value corresponding to as many as 16 reference resistors. However, the speed of converting the input analog data to digital data is not decreased though the settling time for charging the line L0 to change the reference voltage from Vr0 to Vr16 increases. This is because the input voltage Vin rises above the reference voltage Vr8 applied to the first comparator section 2.

As has been described, in the A/D converter of the invention which is a turnaround series-parallel A/D converter, the reference voltage applied through the lower-reference voltage line L0 or L8, above which the input voltage Vin (analog data) increases, remains unchanged, neither charging or discharging the parasitic capacitances C0 to C8 of the lower-reference voltage lines L0 to L8. The A/D converter can therefore convert input analog data to digital data at high speed.

The switches of either the group S0 or the group S1 are selected when the input voltage Vin is nearly equal to the reference voltage Vr8 applied to the first comparator section 2. When the switches of the group S0 are selected, the reference voltage Vr8 to be applied to the second comparator section 4 is input via the lower-reference voltage line L8 to the comparator CPL8 of the section 4. The reference voltage Vr8 is also input to the comparator CPL8 when the switches of the group S1 are selected. To state it generally, if the voltage Vin is nearly equal to an upper-reference voltage Vri (i=8, 16, 32, 40, 48 or 56), the voltage Vri is input to the same comparator of the second comparator section 4, no matter which group of switches has been selected. Thus, the A/D converter would not output inaccurate digital data, even if the comparators differ in operating characteristic because they have been made under different conditions.

The series-parallel A/D converter according to the present invention is advantageous in the following respects.

As mentioned above, the relationship among the voltages applied through the lower-reference voltage lines L0 to L8 is inverted every time the selected block of resistors is switched from an even-numbered one to an odd-numbered one, or the other way around. Since the relationship is switched in turnaround scheme, the voltage Vri nearly equal to the input voltage Vin remains unchanged or changes but very little, shortening the time required for charging or discharging the parasitic capacitances C0 to C8 of the lower-reference voltage lines L0 to L8. The A/D converter can therefore convert input analog data to digital data at high speed.

Furthermore, since the relationship among the voltages applied through the lower-reference voltage lines L0 to L8 is inverted in turnaround scheme when, voltage Vin, if any, is nearly equal to an upper-reference voltage Vri (i=8, 16, 32, 40, 48 or 56), the voltage Vri is input to the same comparator of the second comparator section 4, no matter which group of switches has been selected. The A/D converter therefore would not output inaccurate digital data even if the comparators differ in operating characteristic because they have been made under different conditions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A series-parallel A/D converter comprising:
   an input terminal connected to receive an input voltage;
   a first terminal and a second terminal;
   a plurality of reference resistors connected in series and forming a plurality of blocks, for dividing a voltage applied between said first and second terminals, thereby to generate reference voltages;
   a first comparator section comprised of comparators for comparing the input voltage with the reference voltages which are applied at nodes of the resistors of each blocks and which are used as upper reference voltages, thereby to select one of the blocks which generates a reference voltage nearly equal to the input voltage;
   a plurality of lower-reference voltage lines;
   groups of switches for applying voltages at nodes of the resistors of the blocks, as lower reference voltages, to said lower-reference voltage lines;
   a second comparator unit comprised of comparators for comparing the input voltage with the lower reference voltages applied through said lower-reference voltage lines; and encoding means for generating digital data from the result of comparison performed in said first comparator section and the result of comparison performed in said second comparator section, wherein said groups of switches alternately apply two voltages defined below, each voltage every time the block of reference resistors, which has been selected by said first comparator section, is switched to another:

a) $VL0=Vri+0, \ldots, VLj=Vri+j$ b) $VL0=Vri+j, \ldots, VLj=Vri+0$ where $Vri+0, \ldots Vri+j$ are the voltages applied at the nodes of the reference resistors of the block selected by said first comparator section, $Vri+0 < \ldots < Vri+j$ (i and j are integers identifying the blocks of resistors), and $VL0, \ldots VLj$ are the voltages applied through said lower-reference voltage lines.

2. The A/D converter according to claim 1, wherein said reference resistors are arranged in rows and columns, forming a rectangular wave which extends along the columns of reference resistors, said first comparator section is located at one end of each column of reference resistors., said second comparator section is located at one end of each row of reference resistors, and said lower-reference voltage lines extend along the columns of reference resistors.

3. The A/D converter according to claim 1, wherein said encoding means comprises an upper-bit encoder connected to said first comparator section and a lower-bit encoder connected to said second comparator section.

4. The A/D converter according to claim 3, wherein said lower-bit encoder is controlled by a control signal output from said upper-bit encoder.

5. The A/D converter according to claim 1, wherein said reference resistors comprise $2^n$ resistors, and said encoding means generates n-bit digital data from the result of comparison performed in said first comparator section and the result of comparison performed in said second comparator section.

* * * * *